United States Patent
Tolchinsky et al.

(10) Patent No.: US 7,531,429 B2
(45) Date of Patent: May 12, 2009

(54) METHODS AND APPARATUSES FOR MANUFACTURING ULTRA THIN DEVICE LAYERS FOR INTEGRATED CIRCUIT DEVICES

(75) Inventors: Peter Tolchinsky, Beaverton, OR (US); Irwin Yablok, Portland, OR (US); Chuan Hu, Chandler, AZ (US); Richard D. Emery, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 313 days.

(21) Appl. No.: 11/397,412

(22) Filed: Apr. 3, 2006

(65) Prior Publication Data

US 2006/0177994 A1    Aug. 10, 2006

Related U.S. Application Data

(62) Division of application No. 10/661,738, filed on Sep. 11, 2003, now Pat. No. 7,091,108.

(51) Int. Cl.
*H01L 21/46* (2006.01)
*H01L 21/30* (2006.01)
*H01L 21/76* (2006.01)
*H01L 21/00* (2006.01)
*H01L 21/762* (2006.01)

(52) U.S. Cl. .................. 438/458; 438/455; 438/960; 438/406; 257/E21.569

(58) Field of Classification Search .......... 438/458, 438/455, 406, 960; 257/E21.569
See application file for complete search history.

(56) References Cited

U.S. PATENT DOCUMENTS

| 5,277,748 | A | 1/1994 | Sakaguchi et al. |
| 5,405,802 | A | 4/1995 | Yamagata et al. |
| 5,453,394 | A | 9/1995 | Yonehara et al. |
| 5,854,123 | A | 12/1998 | Sato et al. |
| 6,107,213 | A | 8/2000 | Tayanaka |
| 6,143,628 | A | 11/2000 | Sato et al. |
| 6,246,068 | B1 | 6/2001 | Sato et al. |
| 6,255,731 | B1 | 7/2001 | Ohmi et al. |
| 6,387,829 | B1 | 5/2002 | Usenko et al. |
| 6,633,066 | B1 * | 10/2003 | Bae et al. .......... 257/347 |
| 6,649,492 | B2 | 11/2003 | Chu et al. |
| 6,774,010 | B2 | 8/2004 | Chu et al. |

* cited by examiner

*Primary Examiner*—Luan C Thai
(74) *Attorney, Agent, or Firm*—Blakely, Sokoloff, Taylor & Zafman LLP

(57) ABSTRACT

Embodiments of the invention use silicon on porous silicon wafers to produce a reduced-thickness IC device wafers. After device manufacturing, a temporary support is bonded to the device layer. The uppermost silicon layer is then separated from the silicon substrate by splitting the porous silicon layer. The porous silicon layer and temporary support are then removed and packaging is completed. Embodiments of the invention provide reliable, low cost methods and apparatuses for producing reduced-thickness IC device wafers to substantially increase thermal conductivity between the device layer of an IC device and a heat sink. In alternative embodiments, the layered silicon substrate includes an insulator layer on a layer of porous silicon and a silicon layer on the insulator layer.

13 Claims, 6 Drawing Sheets

US 7,531,429 B2

METHODS AND APPARATUSES FOR MANUFACTURING ULTRA THIN DEVICE LAYERS FOR INTEGRATED CIRCUIT DEVICES

This is a Divisional application of Ser. No. 10/661,738 filed Sep. 11, 2003 now U.S. Pat. No. 7,091,108, which is presently pending.

FIELD

Embodiments of the invention relate generally to the field of heat removal from integrated circuit devices and more specifically to methods and apparatuses for the manufacture of integrated circuit devices providing improved heat dissipation.

BACKGROUND

The trend toward increasing the number of functions of an integrated circuit device (IC device) results in an increase circuit density in the device. With increased circuit density comes an increased processing power (i.e., increased data processing rate and clock speed) for the IC device. As the circuit density and processing power of the IC device increases, so does the amount of heat generated by the IC device. This can have detrimental effects as the reliability and performance of the IC device will decrease with an increase in the amount of heat the IC device is exposed to. It is important, therefore, to have an efficient heat dissipation system for the IC device.

There are a number of conventional methods of heat dissipation for IC devices including, active methods employing fans, refrigerants, or other recycled coolants, and passive methods such as heat sinks or heat spreaders.

FIG. 1 illustrates an IC device and associated packaging employing an integrated heat spreader IHS for heat dissipation in accordance with the prior art. The IC device and associated packaging 100, shown in FIG. 1, includes a substrate 101. IC device wafer 104 having a packaging 103 is coupled to substrate 101 using a plurality of solder bump connections 102. Typically the gap between solder bump connections 102 and the IC device packaging may be filled with an underfill material (e.g., epoxy), not shown. IHS 105 is thermally coupled to the IC device wafer 104. A thermal interface material, not shown, such as grease or gel may be applied between IC device wafer 104 and the IHS 105 to improve the heat transfer from the IC device to the IHS. Typically the IHS is constructed of a ceramic material or a metal such as aluminum or copper. Although aluminum is less expensive, copper has become the metal of choice for IHSs because of its superior heat transfer characteristics (the thermal conductivity of aluminum is 250 W/m K, while the thermal conductivity of copper is 295 W/m K).

Viable methods of providing heat dissipation in IC devices are becoming more and more complex because the conventional heat dissipation solutions are not effective for contemporary processing requirements. The effort continues to improve the heat dissipation of heat sinks by increasing the thermal conductivity of the material used. It is also possible to increase heat dissipation from device by decreasing the thickness of the IC device wafer. The wafer material, typically silicon, has a much lower thermal conductivity than copper. For example the thermal conductivity of silicon is approximately 120 W/m K, while the thermal conductivity of copper is 295 W/m K, as noted above. Therefore, if the thickness of the wafer can be reduced, the heat dissipation capacity of the IC device will be increased.

The IC device wafer, typically, approximately 775 microns, has a device layer that is typically less than 1 micron in thickness, so there is a substantial room to reduce the thickness of the IC device wafer. The reduced-thickness IC device wafer is then attached to the heat sink. Less silicon between the device layer and the heat sink increases the thermal conductivity, and hence the heat dissipation capacity, of the IC device heat dissipation system. Efforts have been made to reduce the thickness of the IC device wafer by polishing and/or grinding the wafer. However, these processes are time consuming and costly. Moreover, in substantially reducing the thickness, the IC device wafer is rendered difficult to handle and process due to how thin the wafer is thereby adding to the manufacturing cost and complexity.

BRIEF DESCRIPTION OF THE DRAWINGS

The invention may be best understood by referring to the following description and accompanying drawings that are used to illustrate embodiments of the invention. In the drawings.

DETAILED DESCRIPTION

Embodiments of the invention provide methods and apparatuses for manufacturing IC devices having substantially reduced device wafer thickness. For one embodiment a layered wafer is created having silicon substrate with a layer of porous silicon on the silicon substrate and a layer of silicon on the layer of porous silicon. After device manufacturing, a temporary support is bonded to the device layer. The uppermost silicon layer is then separated from the silicon substrate by splitting the porous silicon layer. The porous silicon layer and temporary support are then removed and packaging is completed.

In alternative embodiments, the layered silicon substrate includes an insulator layer on a layer of porous silicon and a silicon layer on the insulator layer.

In accordance with various embodiments, the invention provides highly reliable, low cost methods and apparatuses for producing reduced-thickness IC device wafers to substantially increase thermal conductivity between the device layer of an IC device and a heat sink.

In the following description, numerous specific details are set forth. However, it is understood that embodiments of the invention may be practiced without these specific details. In other instances, well-known circuits, structures and techniques have not been shown in detail in order not to obscure the understanding of this description.

Reference throughout the specification to "one embodiment" or "an embodiment" means that a particular feature, structure, or characteristic described in connection with the embodiment is included in at least one embodiment of the present invention. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments.

Moreover, inventive aspects lie in less than all features of a single disclosed embodiment. Thus, the claims following the Detailed Description are hereby expressly incorporated into this Detailed Description, with each claim standing on its own as a separate embodiment of this invention.

Figure 1:
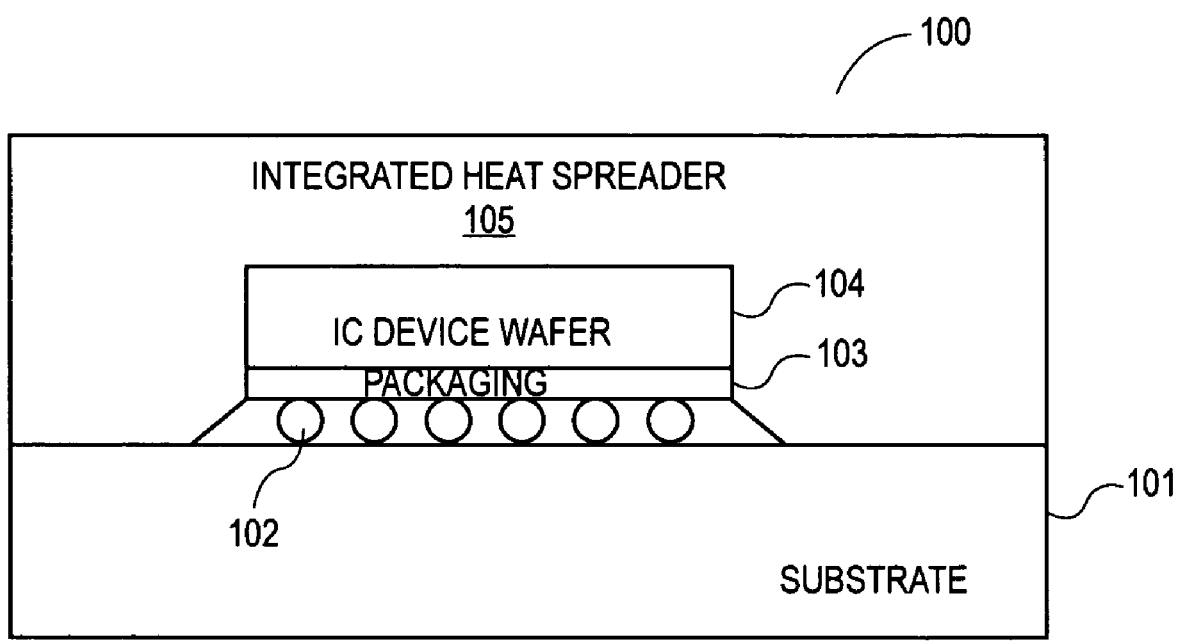
FIG. 1 illustrates an IC device and associated packaging employing an IHS for heat dissipation in accordance with the prior art.
Figure 2:
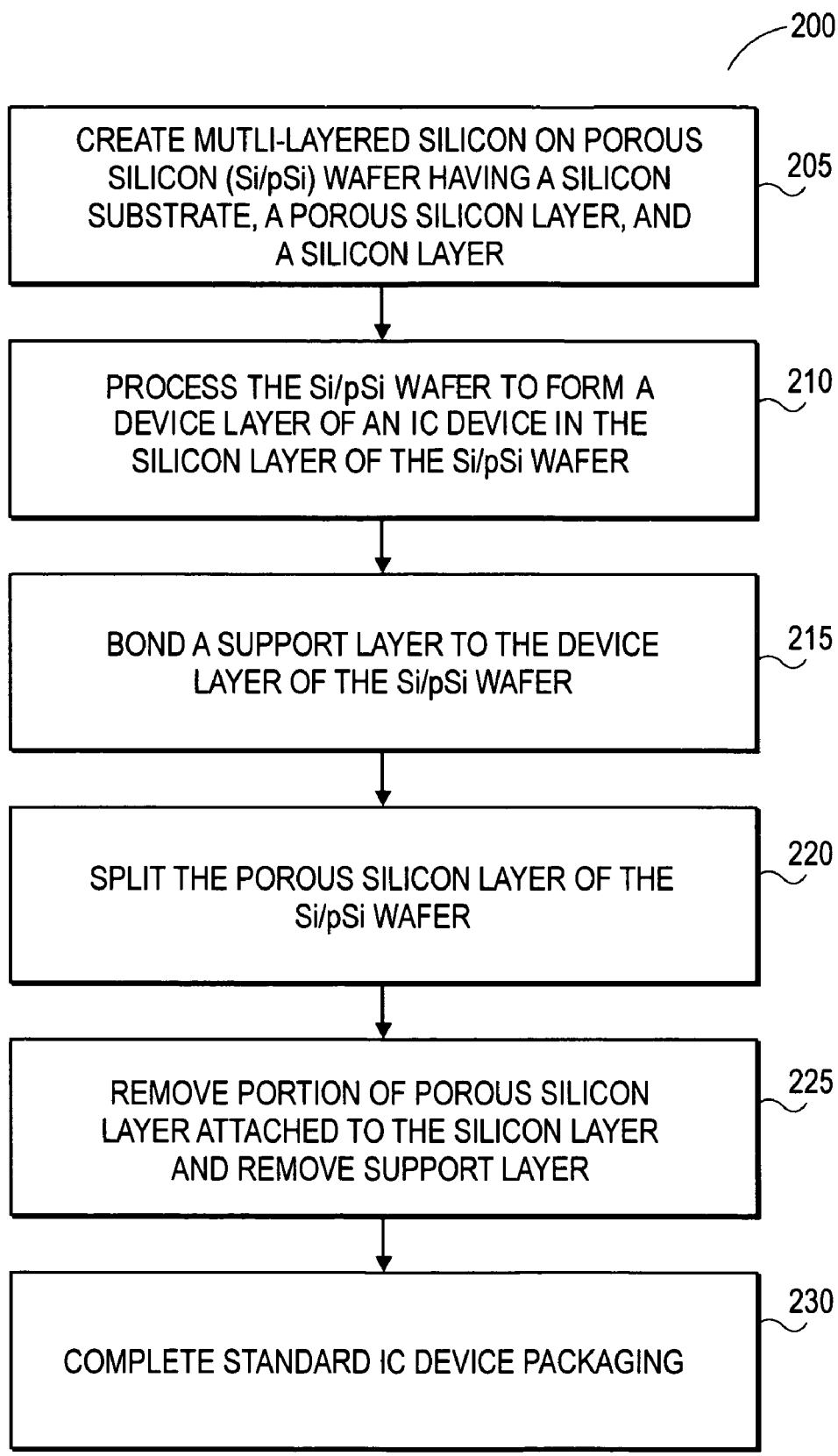
FIG. 2 illustrates a process for producing an IC device having a reduced-thickness device layer in accordance with one embodiment of the invention.

FIG. 2 illustrates a process for producing an IC device having a reduced-thickness device layer in accordance with one embodiment of the invention. Process 200, shown in FIG. 2, begins at operation 205 in which a multi-layered silicon wafer is created having a silicon substrate with a porous silicon layer atop the silicon substrate and a silicon layer atop the porous silicon layer. This wafer will be referred to as a silicon on porous silicon (Si/pSi) wafer.

Figure 3A:
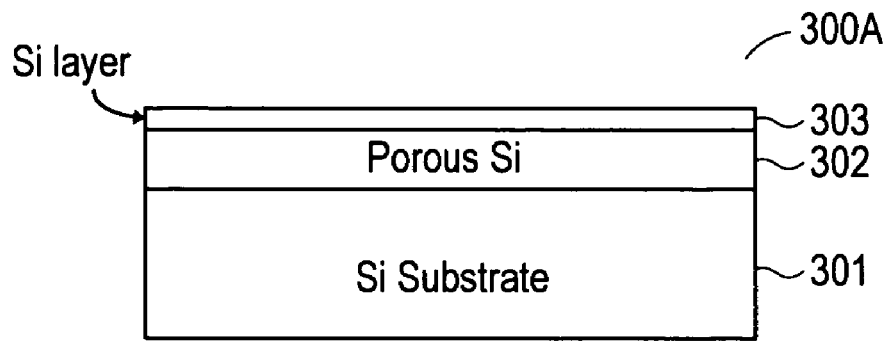
FIG. 3A illustrates a silicon on porous silicon (Si/pSi) wafer created as described at operation 205 of FIG. 2.

FIG. 3A illustrates a Si/pSi wafer created as described at operation 205 of FIG. 2, above. Si/pSi wafer 300A, shown in FIG. 3A, includes a silicon substrate 301, a porous silicon layer 302, and a silicon layer 303. For one embodiment the Si/pSi wafer 300 is approximately 775 microns thick. For one embodiment the silicon layer is in the range of approximately 10-50 microns thick. For one embodiment, the Si/pSi wafer of FIG. 3A is created by starting with a single crystal wafer and using an anodization process to form a porous silicon layer on the surface of the single crystal wafer. For one embodiment, the anodization is effected by dissolving a bulk silicon wafer in an electromechanical cell containing a hydrogen fluoride solution. In one embodiment, a variable density porous silicon layer is formed with a lower density on the top of the porous silicon layer and a higher density on the bottom of the porous silicon layer. In one embodiment the top of the porous silicon layer is treated (healed) and an epitaxial layer is deposited. During initial stage of the deposition process some pores are filled with silicon.

Referring again to FIG. 2, at operation 210 the Si/pSi wafer is processed through a conventional front-end/back-end device manufacturing flow. During this processing, the device layer for the IC device is formed in the silicon layer (i.e., silicon layer 303 of FIG. 3). For one embodiment the device layer is approximately 1 micron or less in thickness.

At operation 215 a temporary support layer is bonded to the device layer of the Si/pSi wafer. For one embodiment the temporary support layer is plastic and the bonding is effected using a conventional adhesive.

Figure 3B:
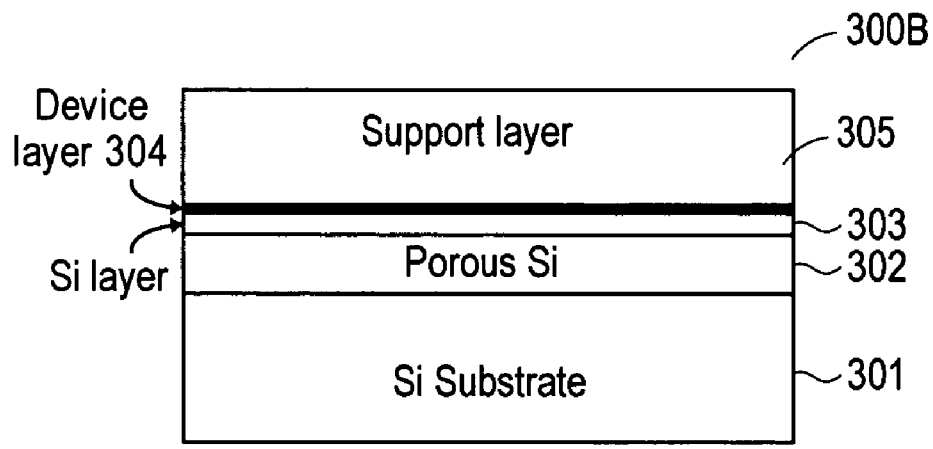
FIG. 3B illustrates the Si/pSi wafer of FIG. 3A subsequent to the processing of operation 210 and the support layer bonding of operation 215.

FIG. 3B illustrates the Si/pSi wafer of FIG. 3A subsequent to the processing of operation 210 and the support layer bonding of operation 215. Si/pSi wafer 300B, shown in FIG. 3B, has silicon substrate 301, porous silicon layer 302, silicon layer 303, on which a device layer 304 has been formed, and support layer 305 bonded to the device layer 304.

Referring once again to FIG. 2, at operation 220 the porous silicon layer of the Si/pSi wafer is split thereby separating the silicon substrate from the device layer. For one embodiment the Si/pSi wafer is split using conventional water-jet techniques as known in the art. In alternative embodiments, any of various wafer-splitting techniques may be employed for splitting the Si/pSi wafer. The support layer provides the support to allow handling and splitting of the Si/pSi wafer.

Figure 3C:
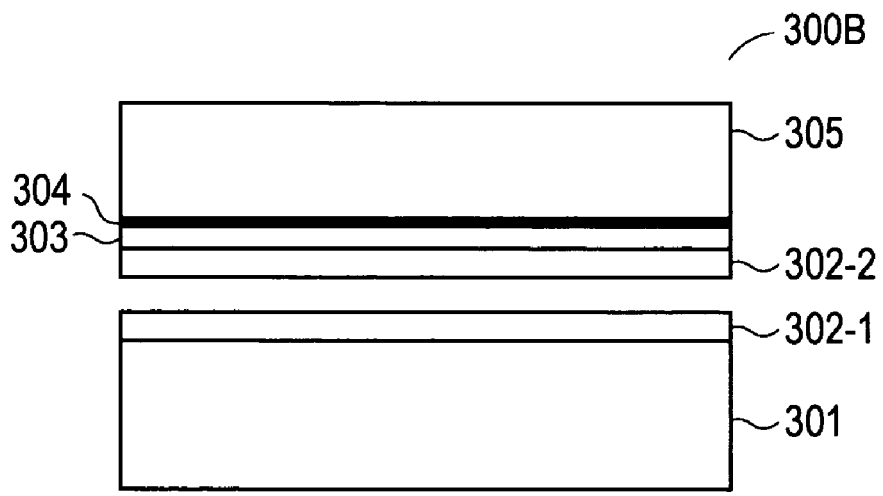
FIG. 3C illustrates the Si/pSi wafer of FIG. 3B subsequent to splitting the Si/pSi wafer through the porous silicon layer at operation 220.

FIG. 3C illustrates the Si/pSi wafer of FIG. 3B subsequent to splitting the Si/pSi wafer through the porous silicon layer at operation 220. Si/pSi wafer 300C, shown in FIG. 3C, has a silicon substrate 301 with a portion 302-1 of porous silicon layer 302 attached. The remaining portion 302-2 of porous silicon layer 302 is attached to the silicon layer 303. Silicon layer 303 has device layer 304 formed thereon and support layer 305 bonded to device layer 304. The support layer 305 provides support for the relatively thin silicon layer 303 having device layer 304 formed thereon. This support allows the silicon layer 303 to be handled and processed.

Referring once again to FIG. 2, at operation 225 the portion 302-2 of porous silicon layer 302 attached to the silicon layer 303 is removed, as is the support layer 305 bonded to device layer 304.

At operation 230 standard IC device packaging is completed. The IC device is singulated (divided into individual die) and the device layer is bonded to a conventional IHS.

As discussed above a Si/pSi wafer is used in accordance with one embodiment of the invention. In accordance with an alternative embodiment a silicon-on-insulator-on-porous-silicon (Si/I/pSi) wafer is used.

Figure 4:
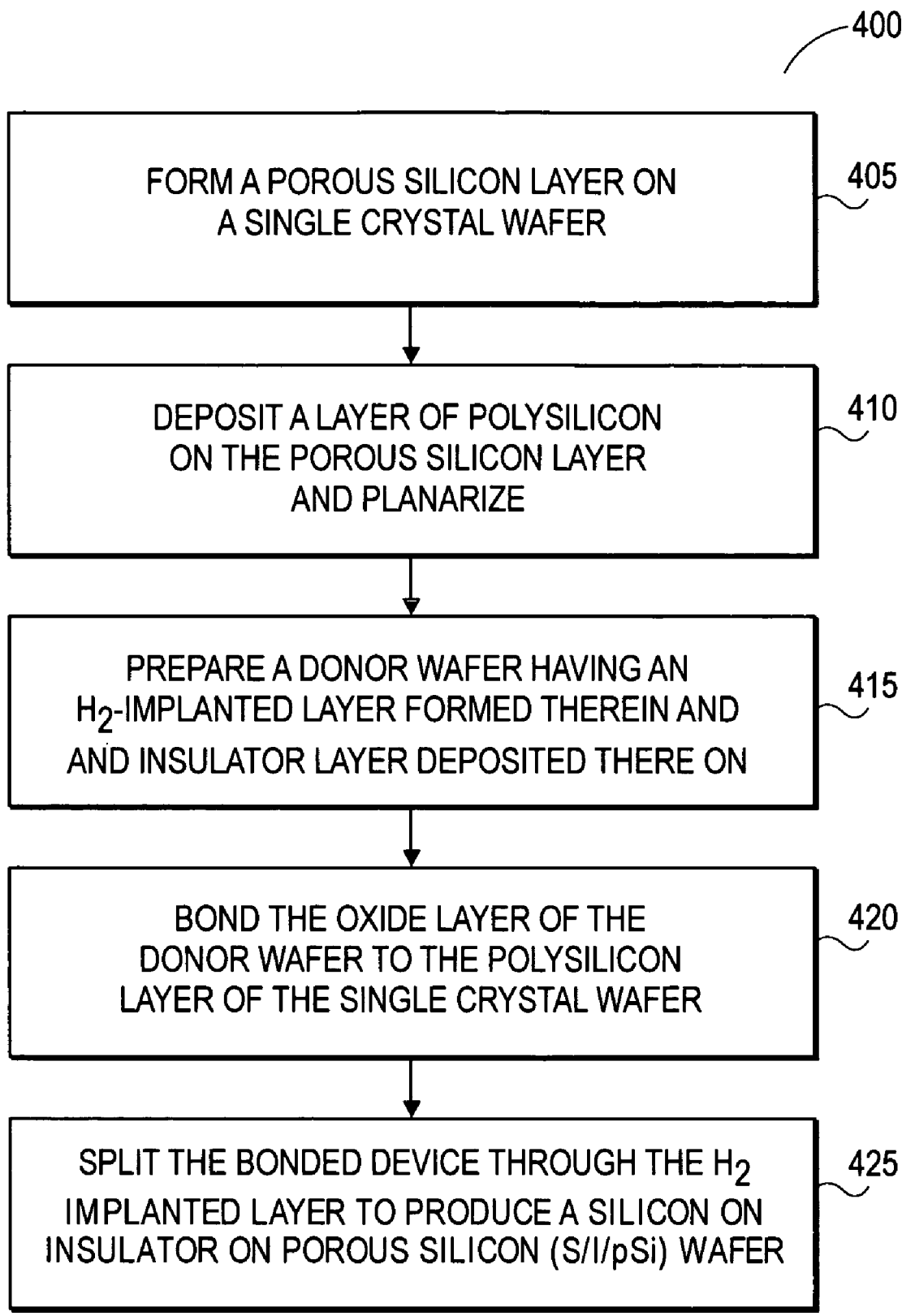
FIG. 4 illustrates a process for producing a silicon on insulator on porous silicon (Si/I/pSi) wafer in accordance with one embodiment of the invention.

FIG. 4 illustrates a process for producing a Si/I/pSi wafer in accordance with one embodiment of the invention. Process 400, shown in FIG. 4, begins at operation 405 in which a porous silicon layer is formed upon a single crystal wafer. For one embodiment an anodization process is used to form the porous silicon layer on the surface of the single crystal wafer. For one embodiment, the anodization is effected by dissolving a bulk silicon wafer in an electromechanical cell containing a hydrogen fluoride solution. In one embodiment, a variable density porous silicon layer is formed with a lower density on the top of the porous silicon layer and a higher density on the bottom of the porous silicon layer.

At operation 410 a polysilicon layer is deposited upon the porous silicon layer and planarized through a conventional planarization process (e.g., CMP).

At operation 415 a donor wafer is prepared using a process in which a donor wafer is implanted with $H_2$ to form an $H_2$-implanted layer within the donor wafer leaving a surface silicon layer, and an insulator layer (e.g., a oxide layer) is deposited thereon.

At operation 420 the oxide layer on the donor wafer is bonded to the planarized polysilicon layer on the single crystal wafer. At operation 425 the bonded device is split through the H2 implanted layer leaving a portion of the surface silicon layer disposed upon the insulator layer forming a silicon layer of the Si/I/pSi wafer. The Si/I/pSi wafer thus produced having a silicon substrate with a porous silicon layer atop the silicon substrate, an insulator layer atop the porous silicon layer, and a silicon layer atop the insulator layer.

FIGS. 5A-5F illustrate the intermediate wafer structures produced during the production of a Si/I/pSi wafer in accordance with one embodiment of the invention.

Figure 5A:
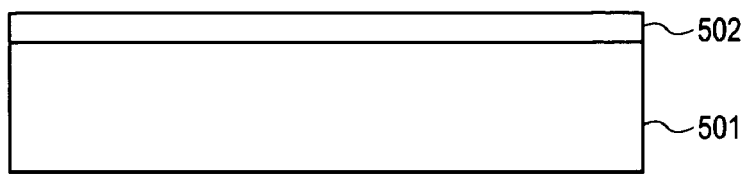
FIGS. 5A-5F illustrate the intermediate wafer structures produced during the production of a Si/I/pSi wafer in accordance with one embodiment of the invention.

FIG. 5A illustrates the single crystal wafer 501 with a porous silicon layer 502 formed thereon.

Figure 5B:
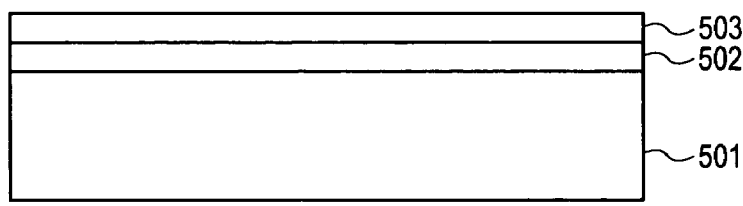

FIG. 5B illustrates the addition of a polysilicon layer 503 that has been deposited upon the porous silicon layer 502 formed upon the single crystal layer 501. As described above the polysilicon layer is planarized subsequent to deposition.

Figure 5C:
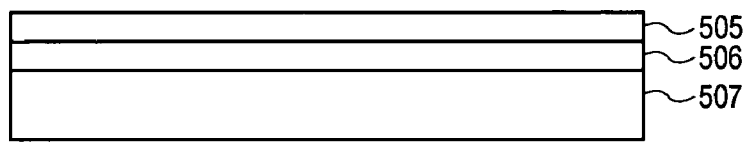

FIG. 5C illustrates a donor wafer 507 having an H$_2$-implanted layer 506 formed within and a surface silicon layer SOS above the H$_2$-implanted layer 506.

Figure 5D:
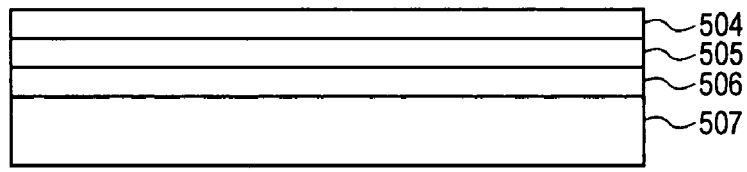

FIG. 5D illustrates the addition of an insulator layer 504 that has been deposited upon the surface silicon layer 505 of the donor wafer 507, illustrated in FIG. 5C.

Figure 5E:
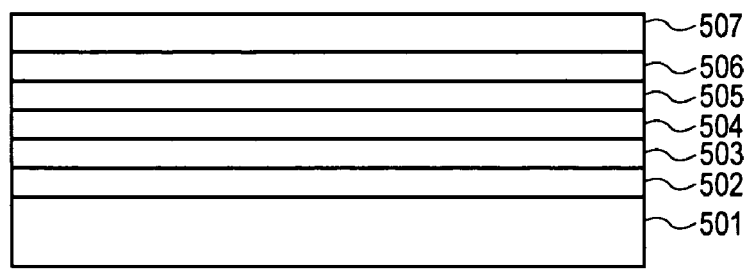

FIG. 5E illustrates the bonding of insulator layer 504 deposited upon donor wafer 507, illustrated in FIG. 5D to the polysilicon layer 503 deposited upon the porous silicon layer 502 formed on the single crystal wafer, illustrated in FIG. 5B.

Figure 5F:
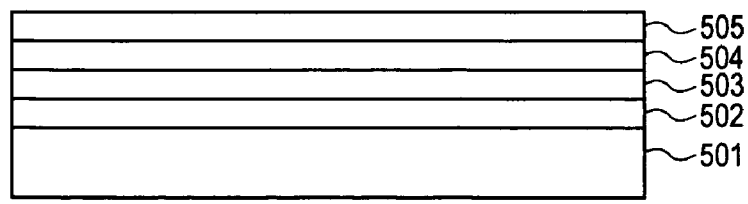

FIG. 5F illustrates the Si/I/pSi wafer formed by splitting the bonded pair illustrated in FIG. 5E through the H2 implanted layer 506 in donor wafer 507 leaving a portion of the silicon layer disposed upon the insulator layer to form the silicon layer of the Si/I/pSi wafer.

For one embodiment the Si/I/pSi wafer illustrated in FIG. 5E is used to produce a reduced-thickness device layer in accordance with one embodiment of the invention by implementing operations 210-230 of process 200, described above in reference to FIG. 2, using the Si/I/pSi wafer in place of the Si/pSi wafer.

General Matters

In accordance with various embodiments, the invention provides highly reliable, low cost methods and apparatuses for producing reduced-thickness IC device wafers to substantially increase thermal conductivity between the device layer of an IC device and a heat sink.

Embodiments of the invention include various operations. Many of the methods are described in their most basic form, but operations can be added to or deleted from any of the methods without departing from the basic scope of the invention. For example, in reference to operation 225 of process 200, described above in reference to FIG. 2, depending on where the porous silicon layer is split, some or all of the portion of the porous silicon layer attached to the silicon layer need not be removed.

Figure 6:
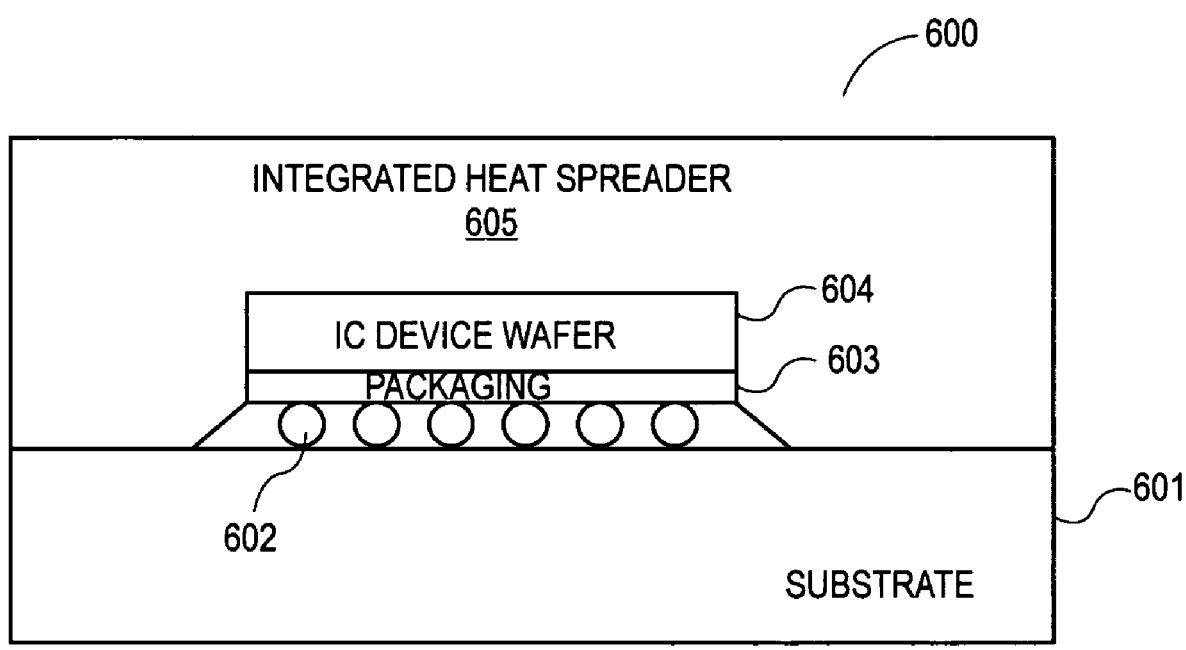
FIG. 6 illustrates an IC device and associated packaging employing an IHS for heat dissipation in accordance with one embodiment of the invention.

FIG. 6 illustrates an IC device and associated packaging employing an IHS for heat dissipation in accordance with one embodiment of the invention. The IC device and associated packaging 600, shown in FIG. 6, includes a substrate 601. IC device wafer 604 is bonded to packaging 603 which is coupled to substrate 601 using a plurality of solder bump connections 602. IHS 605 is thermally coupled to the IC device wafer 604. In accordance with one embodiment the IC device wafer 604 is approximately 10-50 microns thick as opposed to a thickness of approximately 775 microns in prior art devices. The reduced thickness of silicon between the device layer and the heat sink provides for greater heat dissipation.

While the invention has been described in terms of several embodiments, those skilled in the art will recognize that the invention is not limited to the embodiments described, but can be practiced with modification and alteration within the spirit and scope of the appended claims. The description is thus to be regarded as illustrative instead of limiting.

What is claimed is:

1. A method of forming a silicon-on-insulator-on-porous-silicon (Si/I/pSi) wafer comprising:
   forming a porous silicon layer on a silicon substrate;
   depositing a polysilicon layer on the porous silicon layer;
   implanting a H$_2$ layer within a donor wafer such that the donor wafer has a surface silicon layer;
   depositing an insulator layer on the surface silicon layer of the donor wafer;
   bonding the insulator layer to the polysilicon layer to create a bonded pair; and
   splitting the bonded pair through the H2 implanted layer in donor wafer leaving a portion of the silicon layer disposed upon the insulator layer to form a silicon layer of the Si/I/pSi wafer.

2. The method of claim 1 the porous silicon layer is a variable-density porous silicon layer having a relatively higher density near the silicon substrate and a relatively lower density near the polysilicon layer.

3. The method of claim 1 wherein the surface silicon layer is approximately 10-50 microns thick and the device layer is approximately 0.1-1 micron thick.

4. The method of claim 1 wherein the layer of porous silicon is formed using an anodization process.

5. The method of claim 4 wherein the anodization process is effected by dissolving a bulk silicon wafer in an electromechanical cell containing a hydrogen fluoride solution.

6. The method of claim 1 wherein the insulator layer is an oxide layer.

7. A method comprising:
   forming a device layer of an integrated circuit device within a surface silicon layer of a silicon-on-insulator-on-porous-silicon (Si/I/pSi) wafer;
   bonding a support layer to the device layer;
   splitting the porous silicon layer;
   removing any portion of the porous silicon layer from the silicon layer; and
   removing the support layer from the device layer;
   wherein the Si/I/pSi wafer is produced by forming a porous silicon layer on a silicon substrate, depositing a polysilicon layer on the porous silicon layer, implanting a H$_2$ layer within a donor wafer such that the donor wafer has a surface silicon layer, depositing an insulator layer on the surface silicon layer of the donor wafer, bonding the insulator layer to the polysilicon layer to create a bonded pair, and splitting the bonded device through the H2 implanted layer in donor wafer leaving a portion of the silicon layer disposed upon the insulator layer to form a silicon layer of the Si/I/pSi wafer.

8. The method of claim 7 further comprising:
   packaging the device layer using standard integrated circuit packaging; and
   bonding the device layer to an integrated heat spreader.

9. The method of claim 7 wherein the porous silicon layer is a variable-density porous silicon layer having a relatively higher density near the silicon substrate and a relatively lower density near the surface silicon layer.

10. The method of claim 7 wherein the surface silicon layer is approximately 10-50 microns thick and the device layer is approximately 0.1-1 micron thick.

11. The method of claim 7 wherein the layer of porous silicon is formed using an anodization process effected by dissolving a bulk silicon wafer in an electromechanical cell containing a hydrogen fluoride solution.

12. The method of claim 7 wherein the support layer is a plastic layer bonded to the device layer using adhesive.

13. The method of claim 7 wherein polishing is used to remove any portion of the porous silicon layer from the silicon layer of the Si/I/pSi wafer.

* * * * *